United States Patent
Hiyoshi et al.

(10) Patent No.: US 8,765,562 B2
(45) Date of Patent: Jul. 1, 2014

(54) METHOD FOR MANUFACTURING SILICON CARBIDE SEMICONDUCTOR DEVICE

(75) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 114 days.

(21) Appl. No.: 13/613,858

(22) Filed: Sep. 13, 2012

(65) Prior Publication Data

US 2013/0078771 A1 Mar. 28, 2013

Related U.S. Application Data

(60) Provisional application No. 61/540,182, filed on Sep. 28, 2011.

(30) Foreign Application Priority Data

Sep. 28, 2011 (JP) ................................. 2011-211941

(51) Int. Cl.
| | | |
|---|---|---|
| *H01L 21/331* | (2006.01) | |
| *H01L 21/8224* | (2006.01) | |
| *H01L 29/15* | (2006.01) | |
| *H01L 29/739* | (2006.01) | |

(52) U.S. Cl.
USPC ............. 438/311; 438/336; 438/338; 257/77; 257/197

(58) Field of Classification Search
USPC ........... 438/311, 336, 338, 343, 345; 257/77, 257/183, 197
See application file for complete search history.

(56) References Cited

U.S. PATENT DOCUMENTS

2009/0267191 A1  10/2009  Minato et al.
2012/0018743 A1*  1/2012  Hiyoshi et al. .................. 257/77

FOREIGN PATENT DOCUMENTS

WO    WO-2007/096996 A1    8/2007

OTHER PUBLICATIONS

Zhang et al., "9 kV 4H-SiC IGBTs with 88 mΩ cm² of $R_{diff,on}$," Materials Science Forum vol. 556-557 (2007), pp. 771-774.

* cited by examiner

*Primary Examiner* — Hsien Ming Lee
(74) *Attorney, Agent, or Firm* — Venable LLP; Michael A. Sartori

(57) ABSTRACT

A collector layer having p type is formed on a silicon carbide substrate having n type. A drift layer having n type is formed on a top surface side of the collector layer. A body region provided on the drift layer and having p type, and an emitter region provided on the body region to be separated from the drift layer by the body region and having n type are formed. A bottom surface side of the collector layer is exposed by removing the silicon carbide substrate.

15 Claims, 16 Drawing Sheets

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, and in particular to a method for manufacturing a silicon carbide semiconductor device including a collector layer having p type.

2. Description of the Background Art

For example, "9 kV 4H—SiC IGBTs with 88 mΩ·cm² of $R_{diff,on}$" by Qingchun Zhang et al., Mater. Sci. Forum Vols. 556-557 (2007), pp. 771-774 discloses a p channel type IGBT (Insulated Gate Bipolar Transistor) using a 4H—SiC substrate (silicon carbide substrate having a polytype of 4H) having n type. The literature describes that a p channel type IGBT is adopted instead of an n channel type IGBT due to shortage of high-quality, low-resistance p-SiC substrates necessary for the n channel type IGBT.

As described above, it is difficult to prepare a p type SiC substrate for manufacturing an n channel type IGBT, in particular a 4H—SiC substrate suitable for a power semiconductor device, having sufficient properties. This is because bulk growth of p type 4H—SiC is difficult and problems are likely to occur in crystallinity and the like during growth.

SUMMARY OF THE INVENTION

The present invention has been made to solve the aforementioned problem, and one object of the present invention is to provide a method for manufacturing an n channel type IGBT that can start from the step using an n type SiC substrate instead of a p type SiC substrate.

A method for manufacturing a silicon carbide semiconductor device in accordance with one aspect of the present invention includes the steps of: forming, on a silicon carbide substrate having n type, a collector layer having a bottom surface side facing the silicon carbide substrate and a top surface side opposite to the bottom surface side and having p type; forming a drift layer having n type on the top surface side of the collector layer; forming a body region provided on the drift layer and having p type, and an emitter region provided on the body region to be separated from the drift layer by the body region and having n type; forming a gate insulating film on the body region to connect the drift layer and the emitter region; forming a gate electrode on the gate insulating film; and exposing the bottom surface side of the collector layer by removing the silicon carbide substrate.

According to the manufacturing method, a semiconductor device including a drift layer having n type and a collector layer having p type can be obtained using a silicon carbide substrate having n type. Specifically, an n channel type IGBT can be obtained using a silicon carbide substrate having n type.

Preferably, in the manufacturing method in accordance with the one aspect described above, the step of exposing the bottom surface side of the collector layer is performed before the step of forming the gate electrode. This can avoid the gate electrode or a wire that can be provided thereabove such as an emitter wire from being damaged by the step of exposing the bottom surface side of the collector layer.

Preferably, in the manufacturing method in accordance with the one aspect described above, the step of exposing the bottom surface side of the collector layer is performed before the step of forming the gate insulating film. This can avoid the gate insulating film from being damaged by the step of exposing the bottom surface side of the collector layer.

Preferably, in the manufacturing method in accordance with the one aspect described above, the step of exposing the bottom surface side of the collector layer includes the step of removing a portion of the bottom surface side of the collector layer. Thereby, the bottom surface side of the collector layer is more reliably exposed even if there are variations in the steps.

Preferably, in the manufacturing method in accordance with the one aspect described above, the step of forming the collector layer is performed by depositing silicon carbide to a thickness of not less than 10 μm. Thereby, the collector layer is formed, considering a reduction in the thickness of the collector layer due to the step of removing a portion of the collector layer.

Preferably, in the manufacturing method in accordance with the one aspect described above, the step of exposing the bottom surface side of the collector layer is performed such that the collector layer remains with a thickness of not less than 5 μm. Thereby, variations in the thickness of the collector layer can be suppressed, and occurrence of punchthrough can be suppressed.

Preferably, in the manufacturing method in accordance with the one aspect described above, the step of forming the collector layer is performed by depositing silicon carbide containing an acceptor type impurity at a concentration of not less than $1 \times 10^{17}$ cm³ and not more than $1 \times 10^{21}$ cm³. Thereby, an ohmic resistance between the collector layer and an electrode foamed thereon (a collector electrode) can be reduced.

A method for manufacturing a silicon carbide semiconductor device in accordance with another aspect of the present invention includes the steps of: forming, on a silicon carbide substrate having n type, a drift layer having a bottom surface side facing the silicon carbide substrate and a top surface side opposite to the bottom surface side and having n type; exposing the bottom surface side of the drift layer by removing the silicon carbide substrate; forming a collector layer having p type on the bottom surface side of the drift layer; forming a body region provided on the top surface side of the drift layer and having p type, and an emitter region provided on the body region to be separated from the drift layer by the body region and having n type, after the step of forming the collector layer; forming a gate insulating film on the body region to connect the drift layer and the emitter region; and forming a gate electrode on the gate insulating film.

According to the manufacturing method, a semiconductor device including a drift layer having n type and a collector layer having p type can be obtained using a silicon carbide substrate having n type. Specifically, an n channel type IGBT can be obtained using a silicon carbide substrate having n type.

Preferably, in the manufacturing method in accordance with the other aspect described above, the step of forming the collector layer is performed by epitaxial growth on the bottom surface side of the drift layer. Thereby, the collector layer formed by epitaxial growth can be provided in the silicon carbide semiconductor device.

Preferably, in the manufacturing method in accordance with the other aspect described above, the step of forming the collector layer is performed by implanting an impurity onto the bottom surface side of the drift layer. Thereby, the collector layer formed by implanting the impurity can be provided in silicon carbide semiconductor device.

More preferably, activation annealing for activating the impurity in the collector layer is performed after the step of forming the collector layer. In addition, sacrificial oxidation is performed on the collector layer after the step of performing the activation annealing. Thereby, damage on the collector layer caused by the activation annealing can be removed by the sacrificial oxidation.

Further preferably, a protection layer is formed on the collector layer before the step of performing the activation annealing. In addition, the protection layer is removed by oxidation after the step of performing the activation annealing. Thereby, damage on the collector layer caused by the activation annealing can be suppressed. Furthermore, when the sacrificial oxidation on the collector layer is performed, the sacrificial oxidation can be performed on the collector layer subsequent to the removal of the protection layer by oxidation, which can simplify the steps.

Further preferably, the protection layer is a carbon layer. Thereby, the material for the protection layer can be readily oxidized.

Preferably, in the manufacturing method in accordance with the other aspect described above, the step of exposing the bottom surface side of the drift layer includes the step of removing a portion of the bottom surface side of the drift layer. Thereby, the bottom surface side of the drift layer can be more reliably exposed even if there are variations in the steps.

Preferably, in the manufacturing method in accordance with the other aspect described above, the step of exposing the bottom surface side of the drift layer is performed such that the drift layer remains with a thickness of not less than 75 µm. Thereby, breakdown voltage of the silicon carbide semiconductor device can be sufficiently ensured, and the drift layer can have a thickness enough to be handled alone.

As described above, according to the present invention, an n channel type IGBT can be obtained using a silicon carbide substrate having n type.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
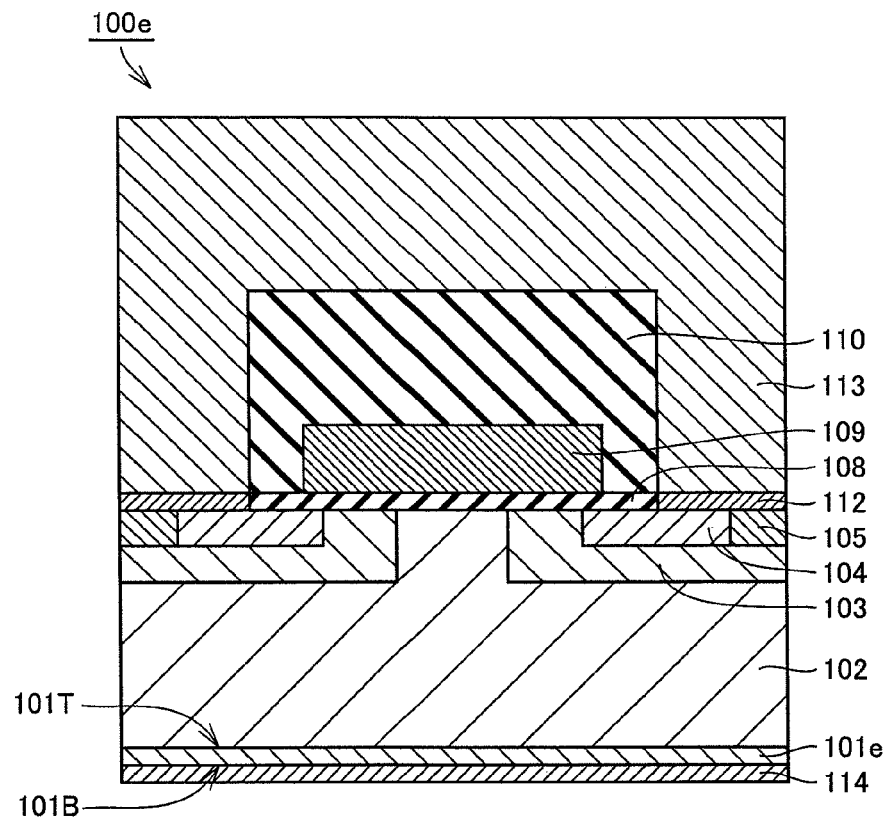
FIG. 1 is a cross sectional view schematically showing a configuration of a silicon carbide semiconductor device in accordance with Embodiment 1 of the present invention.

The following describes embodiments of the present invention with reference to the drawings. It should be noted that in the below-mentioned drawings, the same or corresponding portions are given the same reference characters and are not described repeatedly. Further, in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

Embodiment 1

As shown in FIG. 1, a silicon carbide semiconductor device 100e in the present embodiment is an n channel type IGBT having a planar gate structure. Silicon carbide semiconductor device 100e has a collector layer 101e, a drift layer 102, a body region 103, an emitter region 104, a p+ region 105, a gate insulating film 108, a gate electrode 109, an interlayer insulating film 110, an emitter contact electrode 112, an emitter wire 113, and a collector electrode 114.

Each of collector layer 101e, drift layer 102, body region 103, emitter region 104, and p+ region 105 is made of silicon carbide (SiC), and its crystal structure preferably has a polytype of 4H. Each of collector layer 101e, body region 103, and p+ region 105 has p type, and each of drift layer 102 and emitter region 104 has n type. Emitter region 104 has an impurity concentration higher than that of drift layer 102. P+ region 105 has an impurity concentration higher than that of body region 103. An acceptor type impurity for imparting p type is, for example, aluminum (Al) or boron (B). A donor type impurity for imparting n type is, for example, nitrogen (N) or phosphorus (P). The acceptor type impurity in collector layer 101e has been introduced during epitaxial growth of collector layer 101e, and the acceptor type impurity has a concentration of preferably not less than $1 \times 10^{17}$ cm$^3$ and not more than $1 \times 10^{21}$ cm$^3$, and more preferably not less than $1 \times 10^{19}$ cm$^3$ and not more than $1 \times 10^{20}$ cm$^3$.

Collector layer 101e has a bottom surface side 101B and a top surface side 101T opposite to bottom surface side 101B. Collector layer 101e preferably has a thickness of not less than 5 μm. Drift layer 102 is provided on top surface side 101T of collector layer 101e. Drift layer 102 preferably has a thickness of not less than 75 μm. Body region 103 is provided on drift layer 102. Emitter region 104 is provided on body region 103 to be separated from drift layer 102 by body region 103. P+ region 105 is provided on body region 103 to be in contact with emitter region 104.

Gate insulating film 108 is provided on body region 103 to connect drift layer 102 and emitter region 104. A surface of body region 103 facing gate insulating film 108 (top surface in the drawing) has a plane orientation of preferably {0-33-8}, and more preferably (0-33-8). Gate insulating film 108 is preferably an oxide film, and for example a silicon oxide film. Gate electrode 109 is provided on gate insulating film 108. Gate electrode 109 is made of a conductor, and is made of, for example, polysilicon doped with an impurity, or Al.

Emitter contact electrode 112 is provided on each of emitter region 104 and p+ region 105. Emitter contact electrode 112 is an electrode making ohmic contact with each of emitter region 104 and p+ region 105, is preferably made of silicide, and is made of for example, nickel silicide. Emitter wire 113 is provided on each of emitter contact electrode 112 and interlayer insulating film 110. Interlayer insulating film 110 is provided for electrical insulation between gate electrode 109 and emitter wire 113. Interlayer insulating film 110 is, for example, a silicon oxide film.

Collector electrode 114 is provided on bottom surface side 101B of collector layer 101e. Collector electrode 114 is an electrode making ohmic contact with collector layer 101e, is preferably made of silicide, and is made of, for example, nickel silicide.

Next, an operation of silicon carbide semiconductor device 100e as an IGBT will be described. When a positive voltage applied to gate electrode 109 exceeds a threshold value, an inversion layer is formed in a region of body region 103 that faces gate electrode 109 with gate insulating film 108 interposed between (channel region). Thereby, emitter region 104 and drift layer 102 are electrically connected to each other. Thus, electrons are supplied from emitter region 104 to drift layer 102. Correspondingly, positive holes are supplied from collector layer 101e to drift layer 102. As a result, conductivity modulation takes place in drift layer 102, and thereby a resistivity of drift layer 102 is significantly decreased. Thus, an electrical resistance between emitter contact electrode 112 and collector electrode 114 is significantly decreased. That is, the IGBT is brought into the ON state. On the other hand, when the positive voltage applied to gate electrode 109 is equal to or smaller than the threshold value, the inversion layer is not formed in the channel region, and thus the IGBT is brought into the OFF state.

Figure 2:
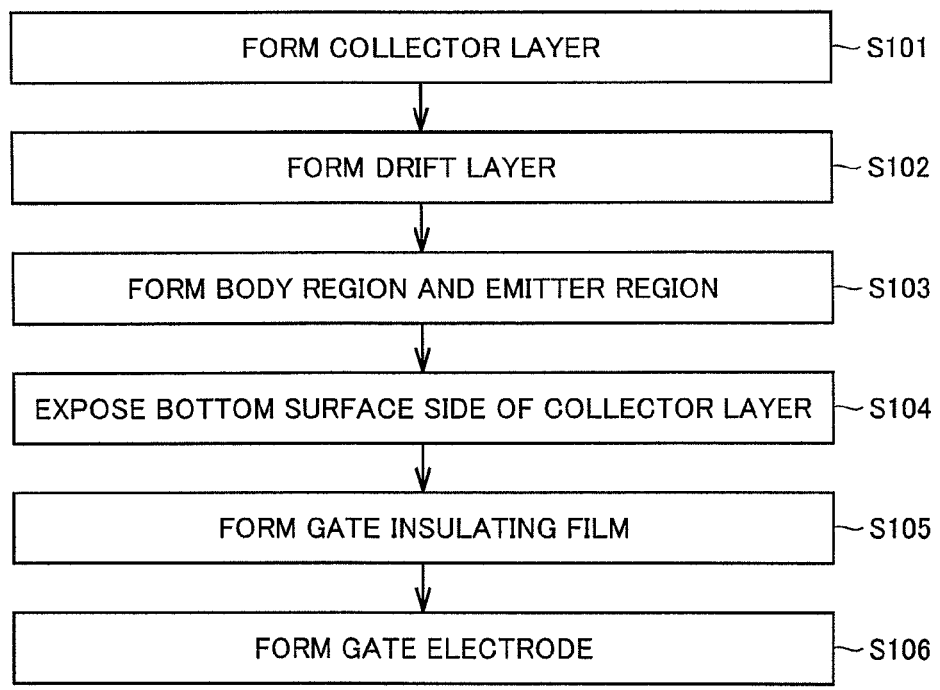
FIG. 2 is a flow diagram schematically showing a method for manufacturing the silicon carbide semiconductor device in accordance with Embodiment 1 of the present invention.

As shown in FIG. 2, a method for manufacturing silicon carbide semiconductor device 100e is generally performed through steps S101 to S106 (FIG. 2). Details of the manufacturing method will be described below.

Figure 3:
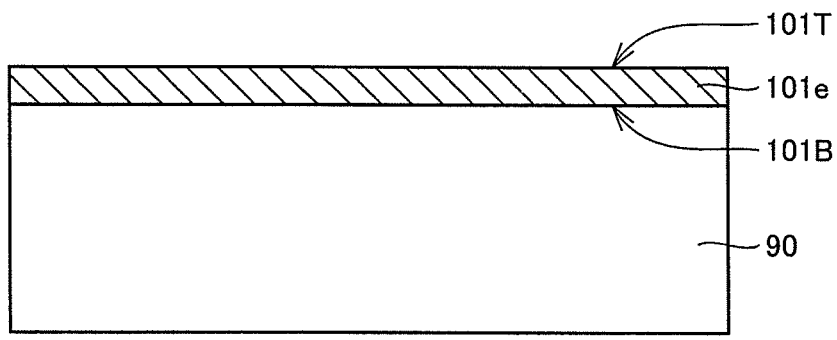
FIG. 3 is a cross sectional view schematically showing a first step of the method for manufacturing the silicon carbide semiconductor device in accordance with Embodiment 1 of the present invention.

As shown in FIG. 3, silicon carbide substrate 90 having n type is prepared. A main surface (top surface in the drawing) of silicon carbide substrate 90 has a plane orientation of preferably {0-33-8}, and more preferably (0-33-8). Next, on the main surface, collector layer 101e having p type is formed by epitaxial growth (FIG. 2: step S101). The epitaxial growth is performed such that the acceptor type impurity in collector layer 101e has a concentration of preferably not less than $1 \times 10^{17}$ cm$^3$ and not more than $1 \times 10^{21}$ cm$^3$, and more preferably not less than $1 \times 10^{19}$ cm$^3$ and not more than $1 \times 10^{20}$ cm$^3$. Such epitaxial growth can be performed, for example, by a CVD (Chemical Vapor Deposition) method. The formation of collector layer 101e is preferably performed by depositing silicon carbide to a thickness of not less than 10 μm.

Figure 4:
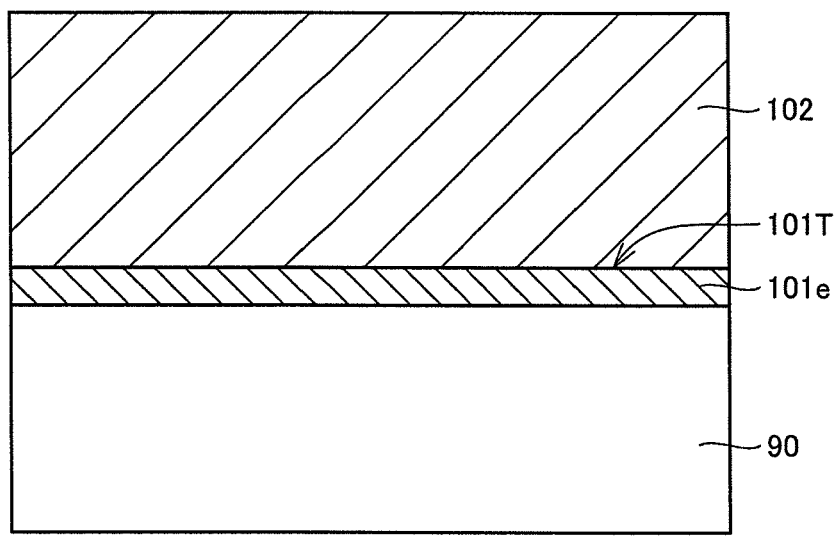
FIG. 4 is a cross sectional view schematically showing a second step of the method for manufacturing the silicon carbide semiconductor device in accordance with Embodiment 1 of the present invention.

As shown in FIG. 4, on top surface side 101T of collector layer 101e, drift layer 102 having n type is formed by epitaxial growth (FIG. 2: step S102).

Figure 5:
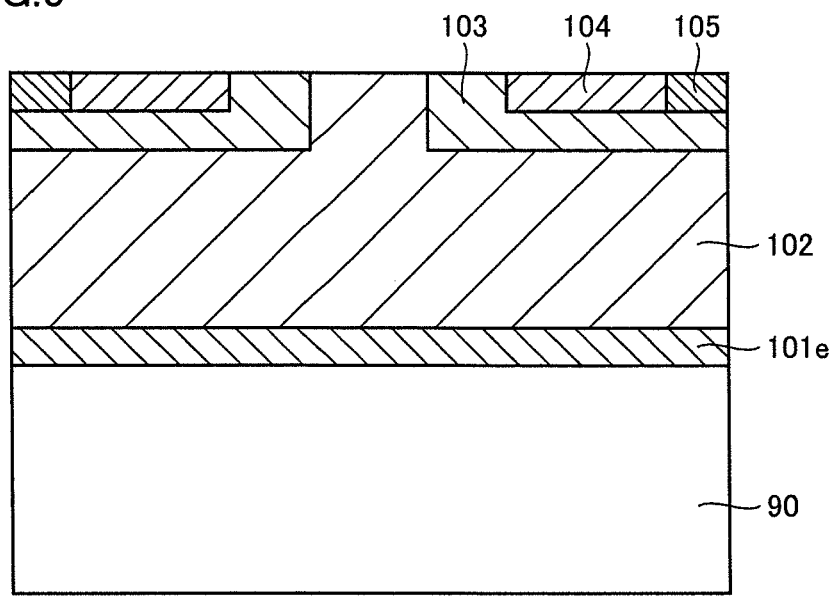
FIG. 5 is a cross sectional view schematically showing a third step of the method for manufacturing the silicon carbide semiconductor device in accordance with Embodiment 1 of the present invention.

As shown in FIG. 5, body region 103 provided on drift layer 102 and having p type, and emitter region 104 provided on body region 103 to be separated from drift layer 102 by body region 103 and having n type are formed (FIG. 2: step S103). In addition, p$^+$ region 105 is formed on body region 103. Each of body region 103, emitter region 104, and p$^+$ region 105 can be formed by ion implantation.

Figure 6:
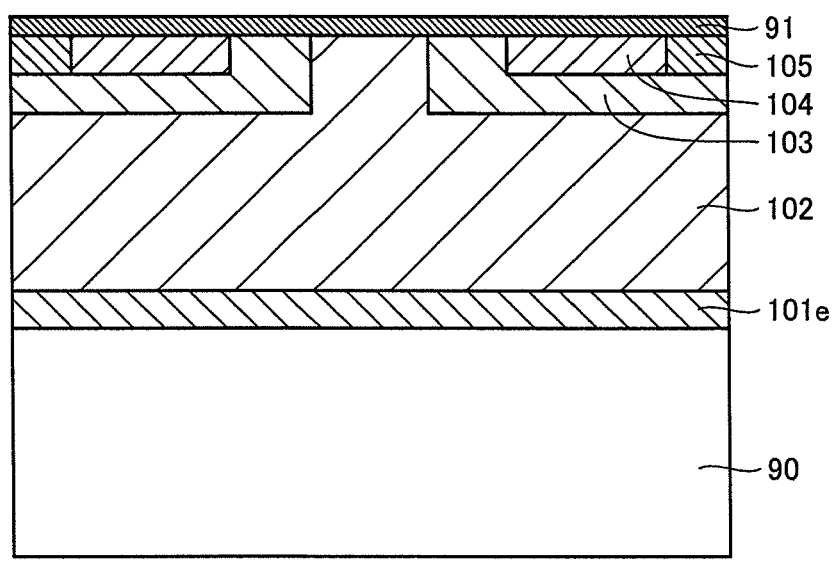
FIG. 6 is a cross sectional view schematically showing a fourth step of the method for manufacturing the silicon carbide semiconductor device in accordance with Embodiment 1 of the present invention.

As shown in FIG. 6, a protection layer 91 is formed on a surface (top surface in the drawing) constituted by drift layer 102, body region 103, emitter region 104, and p$^+$ region 105. Protection layer 91 is preferably made of a material that can be readily oxidized, and is, for example, a carbon layer. Next, activation annealing for activating impurities implanted by the ion implantation is performed. For example, heating at 1700° C. for 30 minutes is performed in an atmosphere of an inert gas such as argon. Then, protection layer 91 is removed. The removal of protection layer 91 can be performed, for example, by oxidation of protection layer 91.

Figure 7:
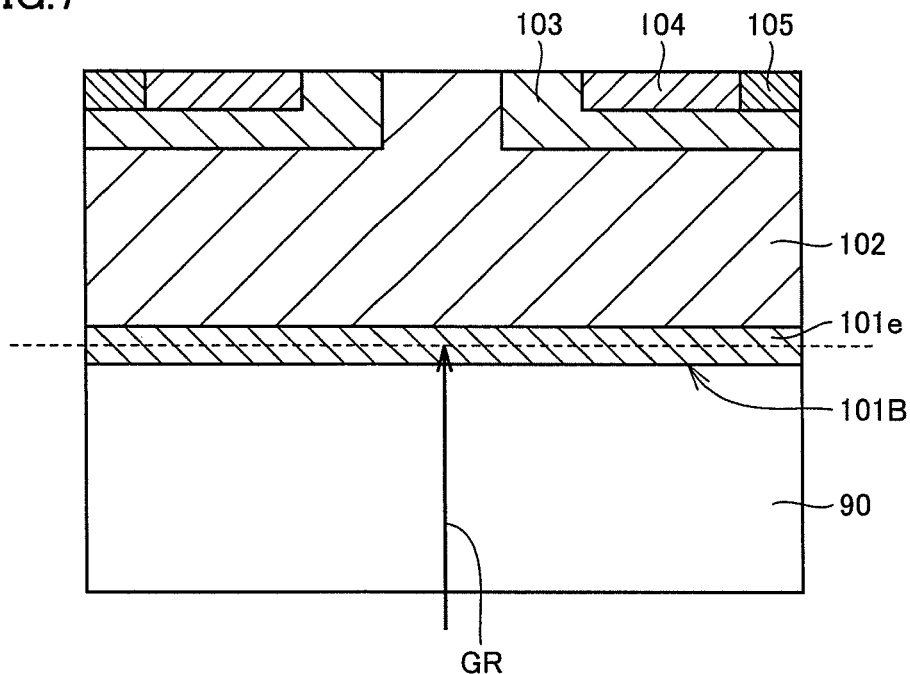
FIG. 7 is a cross sectional view schematically showing a fifth step of the method for manufacturing the silicon carbide semiconductor device in accordance with Embodiment 1 of the present invention.
Figure 8:
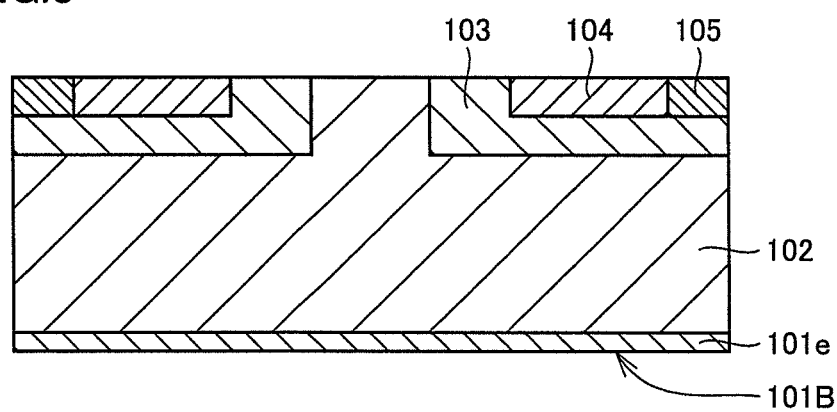
FIG. 8 is a cross sectional view schematically showing a sixth step of the method for manufacturing the silicon carbide semiconductor device in accordance with Embodiment 1 of the present invention.

As shown in FIGS. 7 and 8, bottom surface side 101B of collector layer 101e is exposed by removing silicon carbide substrate 90 (FIG. 2: step S104). Specifically, silicon carbide substrate 90 is removed by performing grinding in a direction indicated by an arrow GR in the drawing, to a position indicated by a broken line. On this occasion, a portion of bottom surface side 101B of collector layer 101e may be removed. Preferably, this removal is performed such that collector layer 101e remains with a thickness of not less than 5 μm.

Figure 9:
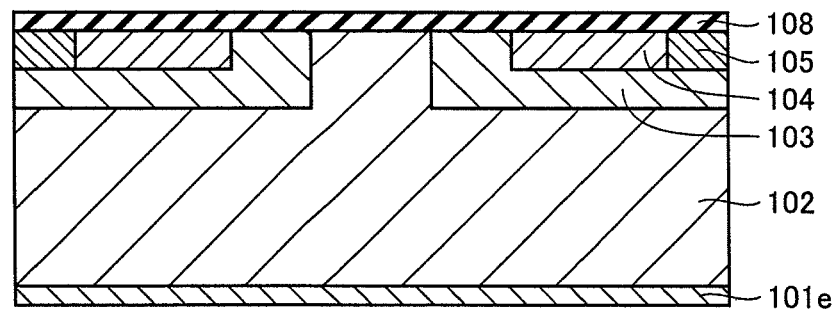
FIG. 9 is a cross sectional view schematically showing a seventh step of the method for manufacturing the silicon carbide semiconductor device in accordance with Embodiment 1 of the present invention.

As shown in FIG. 9, gate insulating film 108 is formed (FIG. 2: step S105). Gate insulating film 108 is foamed on body region 103 to connect drift layer 102 and emitter region 104. The formation of gate insulating film 108 can be performed, for example, by thermal oxidation. The thermal oxidation is performed, for example, by means of heating at 1300° C. for 60 minutes in an oxygen atmosphere.

It should be noted that, after the activation annealing, NO annealing using nitric oxide (NO) gas as an atmosphere gas may be performed. A temperature profile has conditions such as a temperature of not less than 1100° C. and not more than 1300° C., and a retention time of about one hour. Thereby, nitrogen atoms are introduced into an interface region between gate insulating film 108 and body region 103. As a result, formation of an interface state in the interface region is suppressed, and channel mobility in the IGBT can be improved. It should be noted that, if such introduction of nitrogen atoms is possible, a gas other than NO gas may be used as an atmosphere gas. After the NO annealing, Ar annealing using argon (Ar) as an atmosphere gas may be further performed. Preferably, the heating temperature for the Ar annealing is higher than the heating temperature for the NO annealing, and lower than the melting point of gate insulating film 108. This heating temperature is retained, for example, for about one hour. Thereby, the formation of the interface state in the interface region between gate insulating film 108 and body region 103 is further suppressed. It should be noted that another inert gas such as nitrogen gas may be used as an atmosphere gas, instead of Ar gas.

Figure 10:
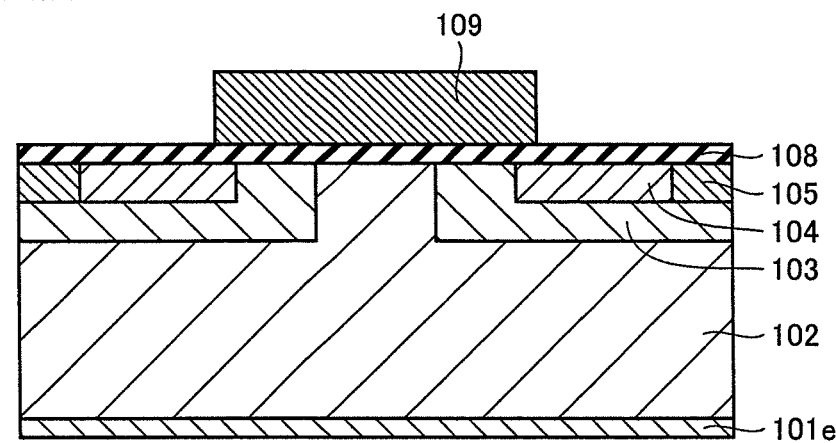
FIG. 10 is a cross sectional view schematically showing an eighth step of the method for manufacturing the silicon carbide semiconductor device in accordance with Embodiment 1 of the present invention.

As shown in FIG. 10, gate electrode 109 is formed on gate insulating film 108 (FIG. 2: step S106). This formation can be performed, for example, by forming a polysilicon film by the CVD method and patterning the polysilicon film by RIE (Reactive Ion Etching).

Figure 11:
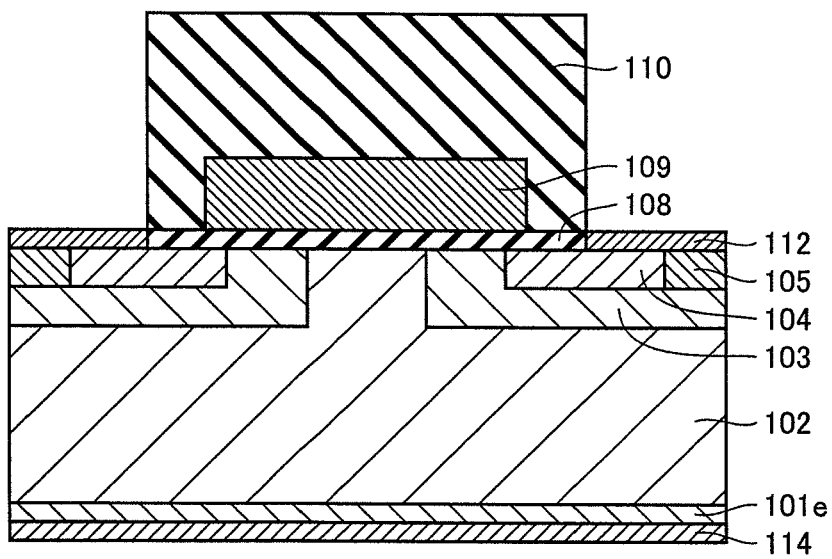
FIG. 11 is a cross sectional view schematically showing a ninth step of the method for manufacturing the silicon carbide semiconductor device in accordance with Embodiment 1 of the present invention.

As shown in FIG. 11, interlayer insulating film 110 is formed. Specifically, interlayer insulating film 110 is formed, for example, by the CVD method, and thereafter portions of interlayer insulating film 110 and gate insulating film 108 corresponding to a region where emitter contact electrode 112 is to be formed are removed by RIE. Then, emitter contact electrode 112 is formed on the region where the portions of interlayer insulating film 110 and gate insulating film 108 have been removed. In addition, collector electrode 114 is formed on collector layer 101e. Specifically, a method for forming emitter contact electrode 112 and collector electrode 114 can be performed by deposition of a metal film such as a nickel film and silicidation thereof.

As shown in FIG. 1, by forming emitter wire 113 (FIG. 1), silicon carbide semiconductor device 100e is obtained. It should be noted that a passivation film (not shown) may be formed.

According to the present embodiment, an n channel type IGBT instead of a p channel type IGBT can be manufactured as shown in FIG. 1, using silicon carbide substrate 90 having n type (FIG. 3).

Further, the step of exposing bottom surface side 101B of collector layer 101e (FIG. 7) is performed before the step of forming gate electrode 109 (FIG. 10). This can avoid gate electrode 109 or emitter wire 113 (FIG. 1) provided thereabove from being damaged by the step of exposing.

Further, the step of exposing bottom surface side 101B of collector layer 101e (FIG. 7) is performed before the step of forming gate insulating film 108 (FIG. 9). This can avoid gate insulating film 108 from being damaged by the step of exposing.

Further, when bottom surface side 101B of collector layer 101e is exposed, a portion of bottom surface side 101B of collector layer 101e may be removed as indicated by the broken line in FIG. 7. Thereby, bottom surface side 101B of collector layer 101e is more reliably exposed even if there are variations in the steps.

Further, the step of forming collector layer 101e (FIG. 3) is preferably performed by depositing silicon carbide to a thickness of not less than 10 μm. Thereby, collector layer 101e can be formed, considering a reduction in the thickness of collector layer 101e due to the step of removing a portion of collector layer 101e (FIG. 7).

Further, the step of exposing bottom surface side 101B of collector layer 101e (FIG. 7) is preferably performed such that collector layer 101e remains with a thickness of not less than 5 μm. Thereby, variations in the thickness of collector layer 101e can be suppressed, and occurrence of punchthrough during the operation of silicon carbide semiconductor device 100e (FIG. 1) can be suppressed.

Further, the step of forming collector layer 101e (FIG. 3) is preferably performed by depositing silicon carbide containing an acceptor type impurity at a concentration of not less than $1\times10^{17}$ cm$^3$ and not more than $1\times10^{21}$ cm$^3$, and more preferably not less than $1\times10^{19}$ cm$^3$ and not more than $1\times10^{20}$ cm$^3$. Thereby, an ohmic resistance between collector layer 101e and collector electrode 114 (FIG. 1) can be reduced.

Embodiment 2

Figure 12:
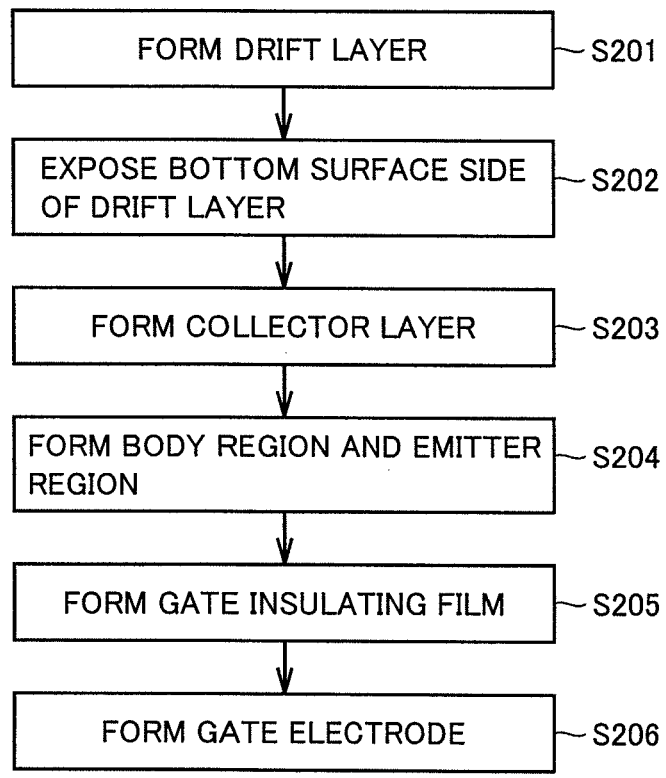
FIG. 12 is a flow diagram schematically showing a method for manufacturing a silicon carbide semiconductor device in accordance with Embodiment 2 of the present invention.

A silicon carbide semiconductor device in the present embodiment is substantially identical to silicon carbide semiconductor device 100e in Embodiment 1. A method for manufacturing the same is generally performed through steps S201 to S206 (FIG. 12). Details of the manufacturing method will be described below.

Figure 13:
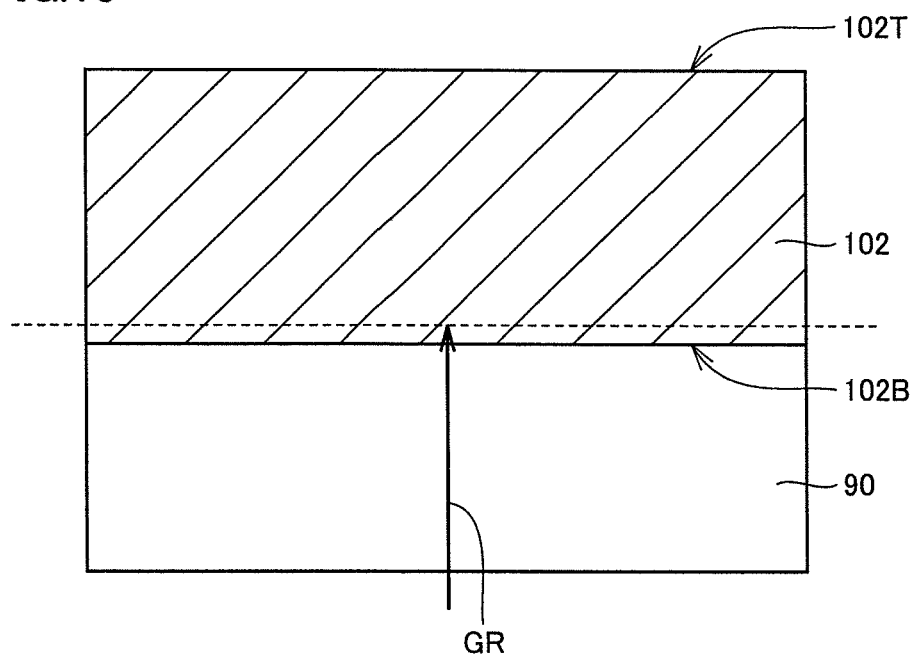
FIG. 13 is a cross sectional view schematically showing a first step of the method for manufacturing the silicon carbide semiconductor device in accordance with Embodiment 2 of the present invention.

As shown in FIG. 13, silicon carbide substrate 90 having n type is prepared. The main surface (top surface in the drawing) of silicon carbide substrate 90 has a plane orientation of preferably {0-33-8}, and more preferably (0-33-8). Next, on the main surface, drift layer 102 having n type is formed by epitaxial growth (FIG. 12: step S201). Drift layer 102 has a bottom surface side 102B facing silicon carbide substrate 90, and a top surface side 102T opposite to the bottom surface side. The epitaxial growth can be performed, for example, by the CVD method using a process gas containing atoms to serve as a donor type impurity.

Figure 14:
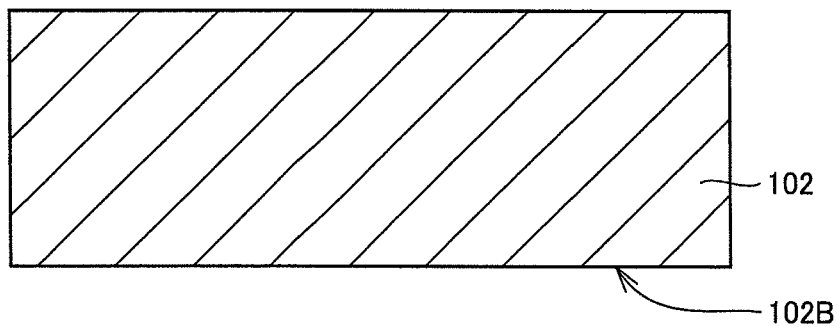
FIG. 14 is a cross sectional view schematically showing a second step of the method for manufacturing the silicon carbide semiconductor device in accordance with Embodiment 2 of the present invention.

As shown in FIGS. 13 and 14, bottom surface side 102B of drift layer 102 is exposed by removing silicon carbide substrate 90 (FIG. 12: step S202). Specifically, silicon carbide substrate 90 is removed by performing grinding in the direction indicated by arrow GR in the drawing, to a position indicated by a broken line. On this occasion, a portion of bottom surface side 102B of drift layer 102 may be removed. Preferably, this removal is performed such that drift layer 102 remains with a thickness of not less than 75 μm.

Figure 15:
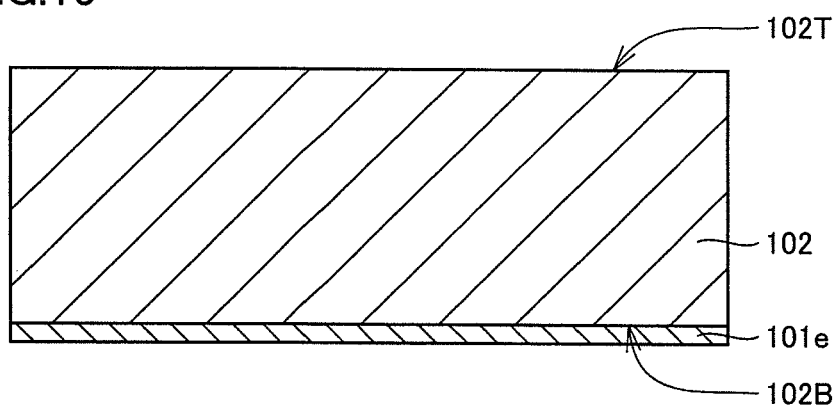
FIG. 15 is a cross sectional view schematically showing a third step of the method for manufacturing the silicon carbide semiconductor device in accordance with Embodiment 2 of the present invention.

As shown in FIG. 15, on bottom surface side 102B of drift layer 102, collector layer 101e having p type is formed (FIG. 12: step S203). In the present embodiment, the formation is performed by epitaxial growth on the bottom surface side of drift layer 102. The epitaxial growth can be performed, for example, by the CVD method using a process gas containing atoms to serve as an acceptor type impurity.

Figure 16:
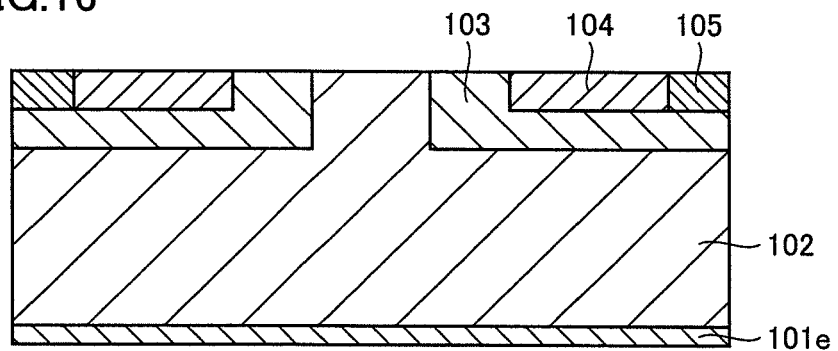
FIG. 16 is a cross sectional view schematically showing a fourth step of the method for manufacturing the silicon carbide semiconductor device in accordance with Embodiment 2 of the present invention.

As shown in FIGS. 15 and 16, body region 103 provided on top surface side 102T of drift layer 102 and having p type, and emitter region 104 provided on body region 103 to be separated from drift layer 102 by body region 103 and having n type are formed (FIG. 12: step S204). In addition, p$^+$ region 105 is formed on body region 103. Each of body region 103, emitter region 104, and p$^+$ region 105 can be formed by ion implantation.

Next, the steps identical to those in FIGS. 9 to 11 (Embodiment 1) are performed. Specifically, gate insulating film 108 is formed (FIG. 12: step S205), gate electrode 109 is then formed (FIG. 12: step S206), and interlayer insulating film 110 and collector electrode 114 are formed. Subsequently, by forming emitter wire 113 (FIG. 1), a structure substantially identical to that of silicon carbide semiconductor device 100e (FIG. 1) is obtained.

According to the present embodiment, an n channel type IGBT instead of a p channel type IGBT can be manufactured using silicon carbide substrate 90 having n type (FIG. 13), as in Embodiment 1 (FIG. 1).

Further, the step of forming collector layer 101e is performed by epitaxial growth on bottom surface side 102B of drift layer 102. Thereby, collector layer 101e formed by epitaxial growth can be provided.

Further, when bottom surface side 102B of drift layer 102 is exposed, a portion of bottom surface side 102B of drift layer 102 may be removed as indicated by the broken line in FIG. 13. Thereby, bottom surface side 102B of drift layer 102 can be more reliably exposed even if there are variations in the steps.

Further, the step of exposing bottom surface side 102B of drift layer 102 (FIG. 13) is preferably performed such that drift layer 102 remains with a thickness of not less than 75 μm. Thereby, breakdown voltage of the silicon carbide semiconductor device can be sufficiently ensured, and drift layer 102 can have a thickness enough to be handled alone as shown in FIG. 14.

Further, since drift layer 102 is formed by epitaxial growth, defects in drift layer 102 can be reduced. Thereby, the breakdown voltage of the silicon carbide semiconductor device can be increased.

Embodiment 3

Figure 17:
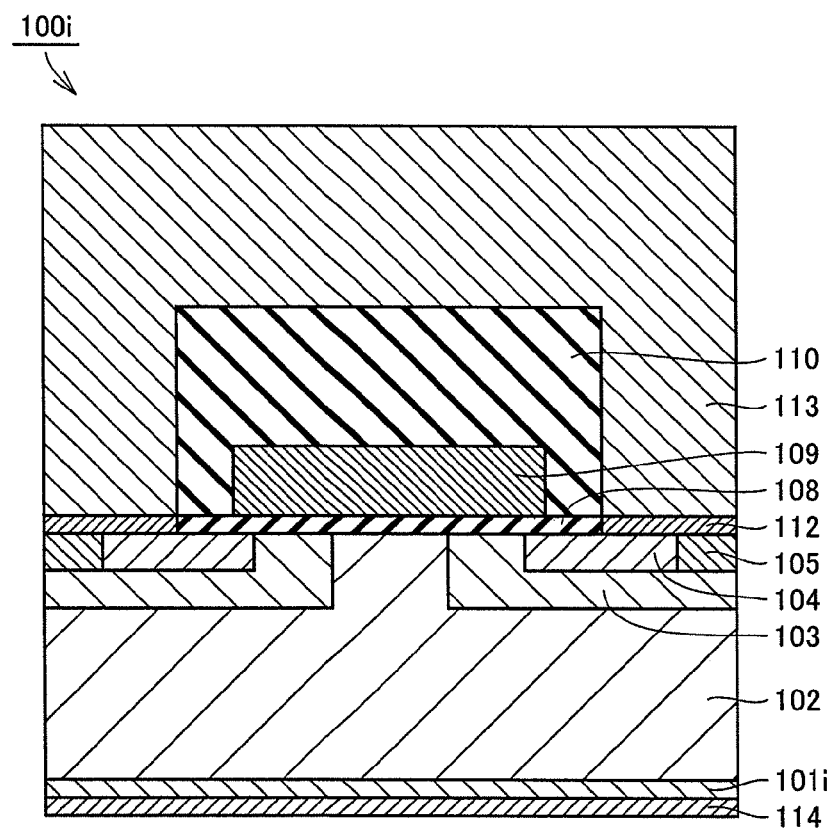
FIG. 17 is a cross sectional view schematically showing a configuration of a silicon carbide semiconductor device in accordance with Embodiment 3 of the present invention.

As shown in FIG. 17, a silicon carbide semiconductor device 100i in the present embodiment has a collector layer 101i having an acceptor type impurity introduced by ion implantation, instead of collector layer 101e having an acceptor type impurity introduced by epitaxial growth. Since the configuration of silicon carbide semiconductor device 100i is substantially identical to that in Embodiment 2 other than that, the same or corresponding elements are given the same reference characters and are not described repeatedly.

Although a method for manufacturing silicon carbide semiconductor device 100i is identical to that in Embodiment 2 in that it is performed through steps S201 to S206 (FIG. 12), it is different from that in Embodiment 2 in details. Hereinafter, the method for manufacturing silicon carbide semiconductor device 100i will be described.

Firstly, with the step identical to the step in FIG. 14 (Embodiment 2), drift layer 102 having exposed bottom surface side 102B is formed (FIG. 12: step S201).

Figure 18:
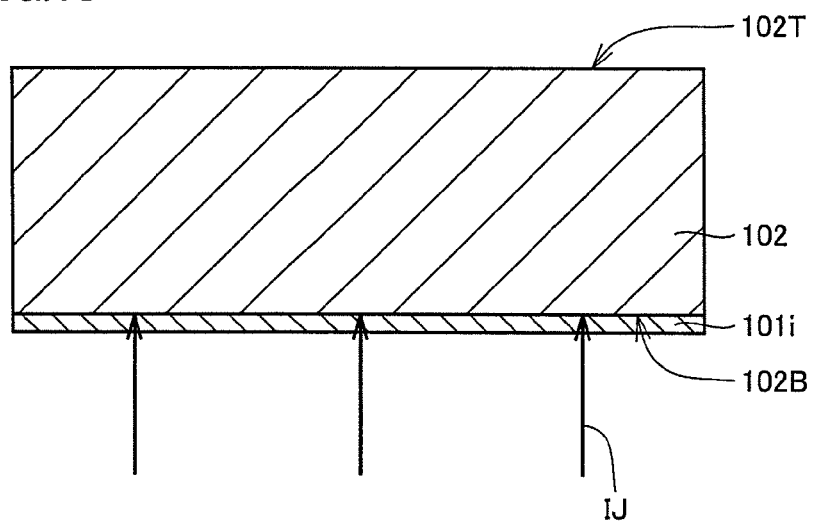
FIG. 18 is a cross sectional view schematically showing a first step of a method for manufacturing the silicon carbide semiconductor device in accordance with Embodiment 3 of the present invention.

As shown in FIG. 18, collector layer 101i is formed by implanting an acceptor type impurity onto bottom surface side 102B of drift layer 102 (indicated by arrows IJ in the drawing).

Figure 19:
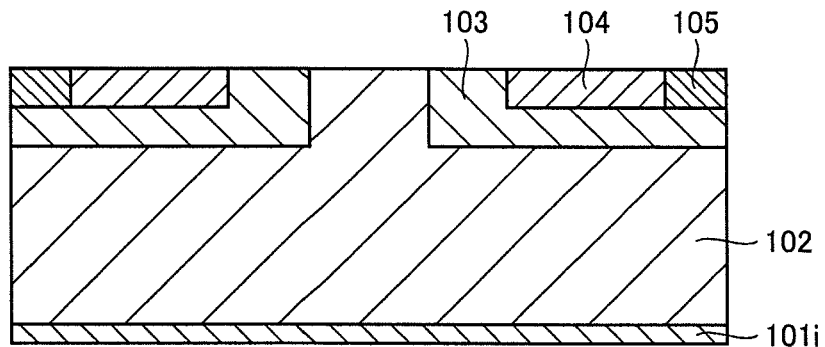
FIG. 19 is a cross sectional view schematically showing a second step of the method for manufacturing the silicon carbide semiconductor device in accordance with Embodiment 3 of the present invention.

As shown in FIG. 19, body region 103 provided on top surface side 102T of drift layer 102 and having p type, and emitter region 104 provided on body region 103 to be separated from drift layer 102 by body region 103 and having n type are formed (FIG. 12: step S204). In addition, p$^+$ region 105 is formed on body region 103. Each of body region 103, emitter region 104, and p$^+$ region 105 can be formed by ion implantation.

Figure 20:
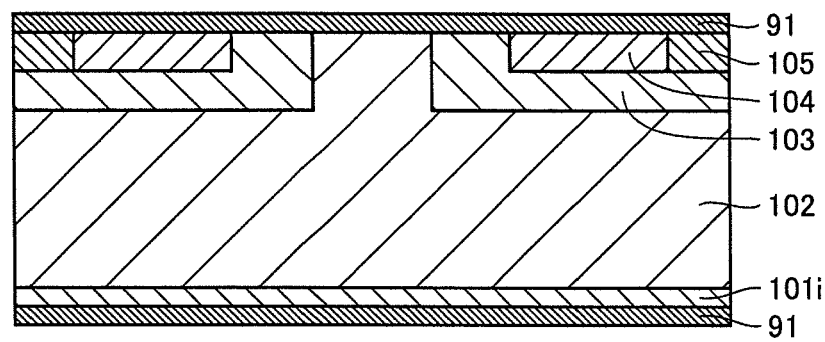
FIG. 20 is a cross sectional view schematically showing a third step of the method for manufacturing the silicon carbide semiconductor device in accordance with Embodiment 3 of the present invention.

As shown in FIG. 20, protection layer 91 is formed on collector layer 101i. Further, another protection layer 91 is formed on the top surface side of drift layer 102 having body region 103, emitter region 104, and p$^+$ region 105 formed therein. Each protection layer 91 is made of a material that can be oxidized, and is preferably a carbon layer. Next, activation annealing for activating impurities in collector layer 101i, body region 103, emitter region 104, and p$^+$ region 105 is performed.

Figure 21:
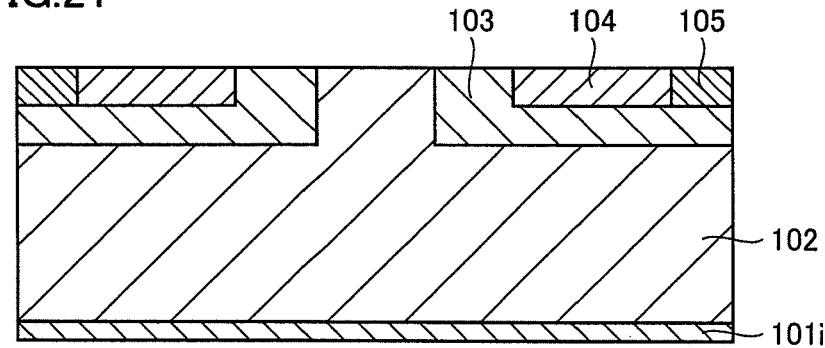
FIG. 21 is a cross sectional view schematically showing a fourth step of the method for manufacturing the silicon carbide semiconductor device in accordance with Embodiment 3 of the present invention.

As shown in FIG. 21, after the activation annealing, protection layers 91 are removed by oxidation. In addition, sacrificial oxidation is performed on a bottom surface side of collector layer 101i. The removal of protection layers 91 by oxidation and the sacrificial oxidation of the bottom surface side of collector layer 101i can be performed continuously, because they are both oxidation steps. An oxidized portion of collector layer 101i is removed by etching.

Further, by performing the steps including steps S205 and S206 (FIG. 12) as in Embodiment 2, silicon carbide semiconductor device 100i (FIG. 17) is obtained.

According to the present embodiment, the step of forming collector layer 101i is performed by implanting an impurity onto bottom surface side 102B of drift layer 102, as shown in FIG. 18. Thereby, collector layer 101i formed by implanting the impurity can be provided in silicon carbide semiconductor device 100i.

Further, activation annealing for activating the impurity in collector layer 101i is performed after the step of forming collector layer 101i. In addition, sacrificial oxidation is performed on collector layer 101i after the step of performing the activation annealing. Thereby, damage on collector layer 101i caused by the activation annealing can be removed by the sacrificial oxidation.

Further, protection layer 91 is formed on collector layer 101i before the step of performing the activation annealing. In addition, the protection layer is removed by oxidation after the step of performing the activation annealing. Thereby, damage on collector layer 101i caused by the activation annealing can be suppressed. Furthermore, when the sacrificial oxidation on collector layer 101i is performed, the sacrificial oxidation can be performed on collector layer 101i subsequent to the removal of protection layer 91 by oxidation, which can simplify the steps.

Embodiment 4

Figure 22:
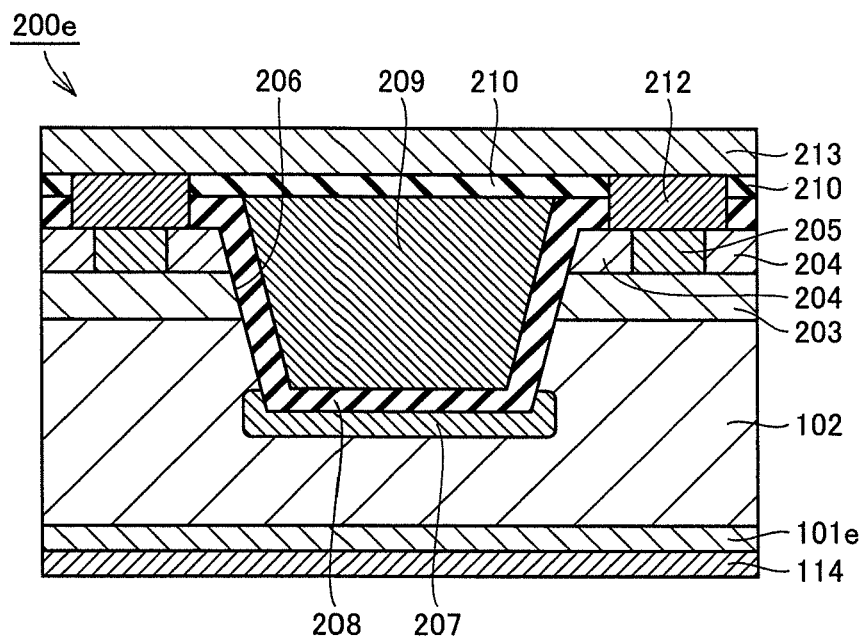
FIG. 22 is a cross sectional view schematically showing a configuration of a silicon carbide semiconductor device in accordance with Embodiment 4 of the present invention.

As shown in FIG. 22, a silicon carbide semiconductor device 200e in the present embodiment is an n channel type IGBT having a trench gate structure. Silicon carbide semiconductor device 200e has collector layer 101e, drift layer 102, and collector electrode 114 as those in Embodiment 1. Further, silicon carbide semiconductor device 200e has a body region 203, an emitter region 204, a p$^+$ region 205, a gate insulating film 208, a gate electrode 209, an interlayer insulating film 210, an emitter contact electrode 212, and an emitter wire 213.

Gate insulating film 208 is provided on an inner wall of a trench 206 to connect drift layer 102 and emitter region 204. A surface of body region 203 facing gate insulating film 208 has a plane orientation of preferably {0-33-8}, and more preferably (0-33-8).

Although a method for manufacturing silicon carbide semiconductor device 200e is identical to that in Embodiment 1 in that it is performed through steps S101 to S106 (FIG. 2), it is different from that in Embodiment 1 in details. Hereinafter, the method for manufacturing silicon carbide semiconductor device 200e will be described.

Firstly, as steps S101 and S102 (FIG. 2), the steps identical to those up to the step in FIG. 4 (Embodiment 1) are performed.

Figure 23:
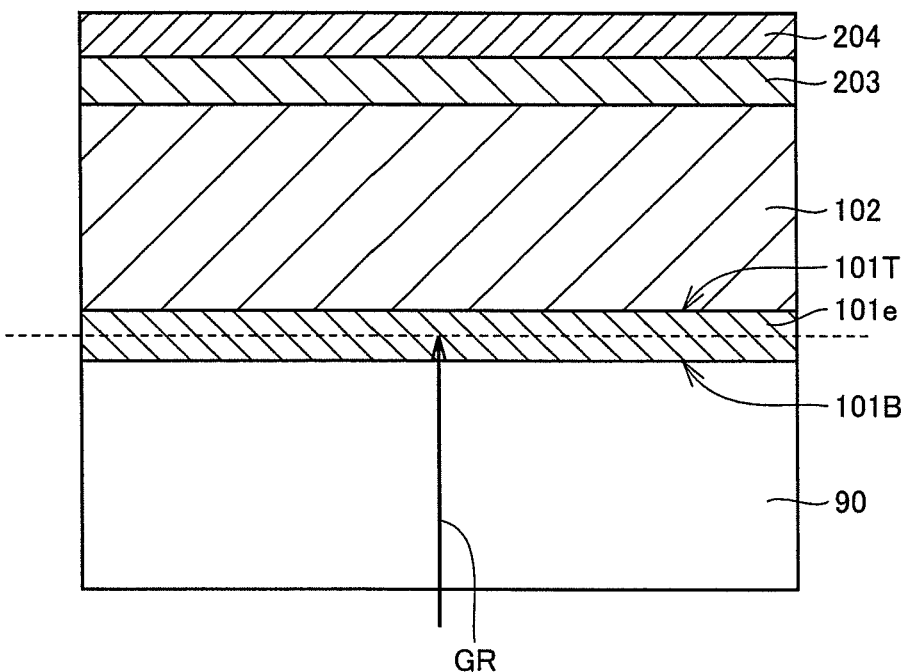
FIG. 23 is a partial cross sectional view schematically showing a first step of a method for manufacturing the semiconductor device in accordance with Embodiment 4 of the present invention.

As shown in FIG. 23, body region 203 provided on drift layer 102 and having p type, and emitter region 204 provided on body region 203 to be separated from drift layer 102 by body region 203 and having n type are formed (FIG. 2: step S103). Body region 203 and emitter region 204 can be formed, for example, by ion implantation.

Figure 24:
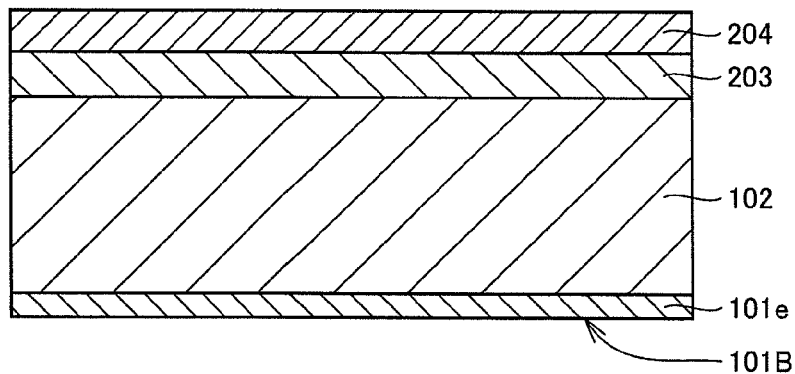
FIG. 24 is a partial cross sectional view schematically showing a second step of the method for manufacturing the semiconductor device in accordance with Embodiment 4 of the present invention.

As shown in FIGS. 23 and 24, bottom surface side 101B of collector layer 101e is exposed by removing silicon carbide substrate 90 (FIG. 2: step S104). Specifically, silicon carbide substrate 90 is removed by performing grinding in the direction indicated by arrow GR in the drawing, to a position indicated by a broken line. On this occasion, a portion of bottom surface side 101B of collector layer 101e may be removed. Preferably, this removal is performed such that collector layer 101e remains with a thickness of not less than 5 μm.

Figure 25:
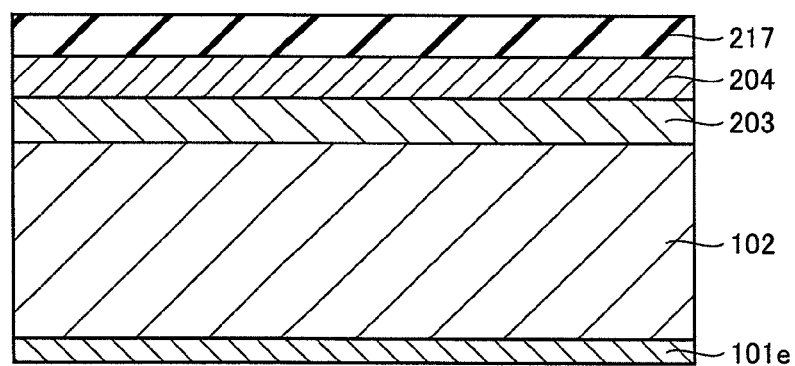
FIG. 25 is a partial cross sectional view schematically showing a third step of the method for manufacturing the semiconductor device in accordance with Embodiment 4 of the present invention.
Figure 26:
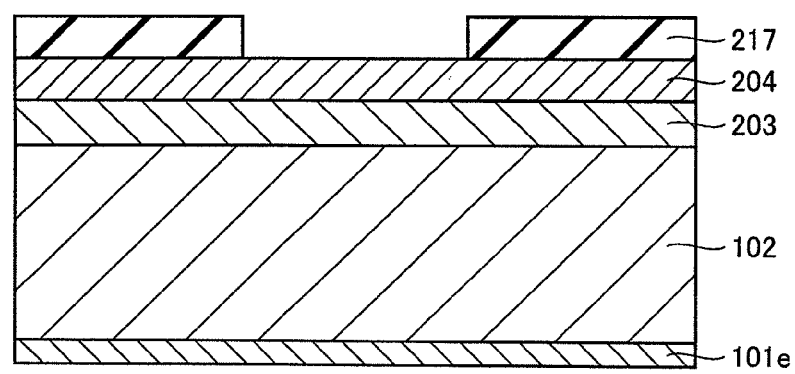
FIG. 26 is a partial cross sectional view schematically showing a fourth step of the method for manufacturing the semiconductor device in accordance with Embodiment 4 of the present invention.
Figure 27:
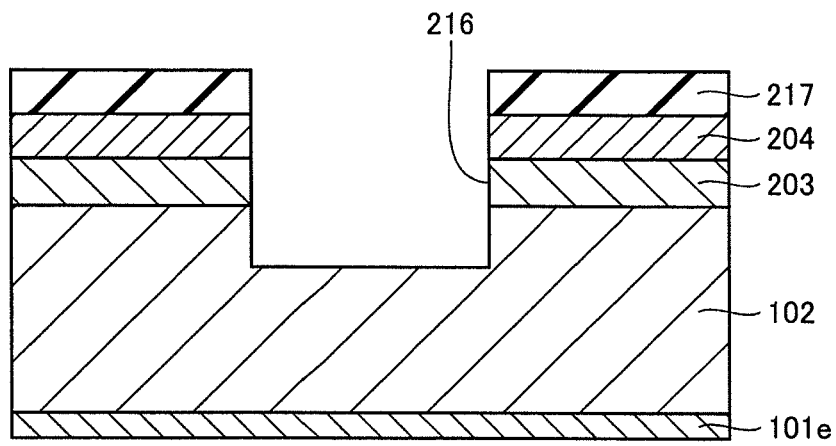
FIG. 27 is a partial cross sectional view schematically showing a fifth step of the method for manufacturing the semiconductor device in accordance with Embodiment 4 of the present invention.

As shown in FIG. 25, a mask layer 217 is formed on emitter region 204. As mask layer 217, for example, an insulating film such as a silicon oxide film can be used. As shown in FIG. 26, an opening is formed in mask layer 217. The formation of the opening can be performed using photolithography. As shown in FIG. 27, a vertical trench 216 is formed by etching using mask layer 217.

Figure 28:
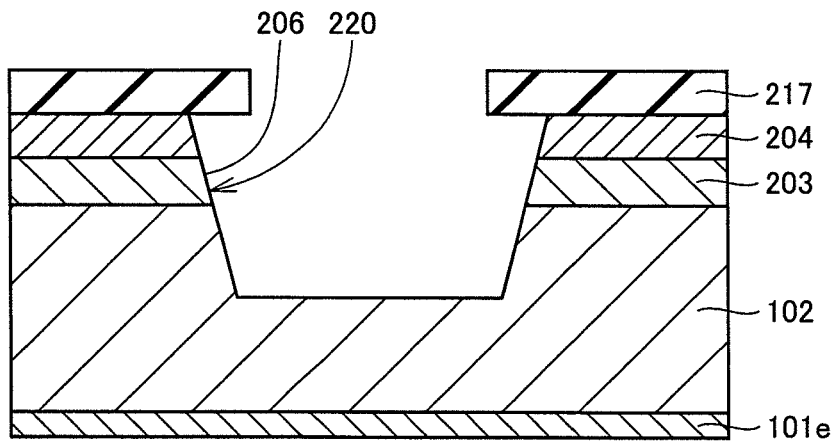
FIG. 28 is a partial cross sectional view schematically showing a sixth step of the method for manufacturing the semiconductor device in accordance with Embodiment 4 of the present invention.

As shown in FIG. 28, trench 206 having side walls 220 is formed. This formation can be performed by thermal etching for exhibiting a predetermined crystal plane in each of drift layer 102, body region 203, and emitter region 204. Specifically, heat treatment using a mixed gas of oxygen gas and chlorine gas as a reactive gas is performed. The crystal plane exhibited at each of side walls 220 is, for example, {0-33-8}. Next, mask layer 217 is removed by any method such as etching.

Subsequently, a resist film (not shown) having a predetermined pattern is formed using the photolithography method so as to extend from the inside of trench 206 onto an upper surface of emitter region 204. As the resist film, there can be used a resist film having an opening pattern in conformity with a bottom portion of trench 206 and a portion of the upper surface of emitter region 204.

Figure 29:
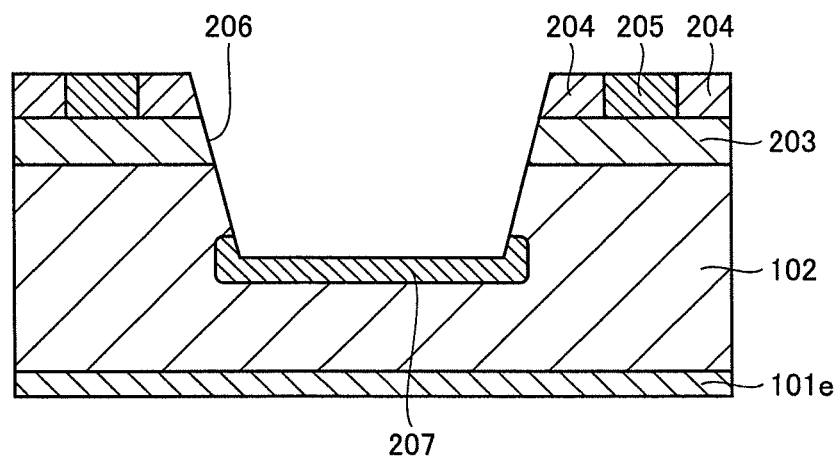
FIG. 29 is a partial cross sectional view schematically showing a seventh step of the method for manufacturing the semiconductor device in accordance with Embodiment 4 of the present invention.

As shown in FIG. 29, by implanting ions of an acceptor type impurity using the resist film as a mask, an electric field relaxing region 207 is formed at the bottom portion of trench 206, and p$^+$ region 205 is formed at a portion of emitter region 204. Thereafter, the resist film is removed. Next, activation annealing is performed to activate the impurity implanted by the ion implantation.

Figure 30:
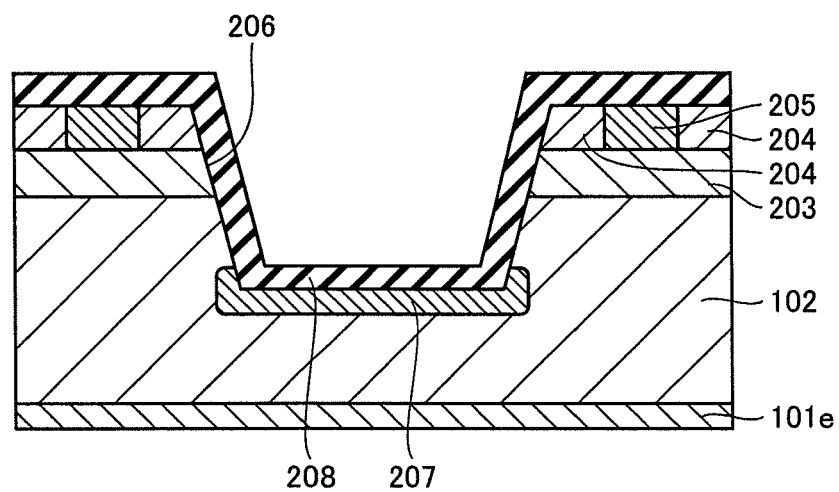
FIG. 30 is a partial cross sectional view schematically showing an eighth step of the method for manufacturing the semiconductor device in accordance with Embodiment 4 of the present invention.
Figure 31:
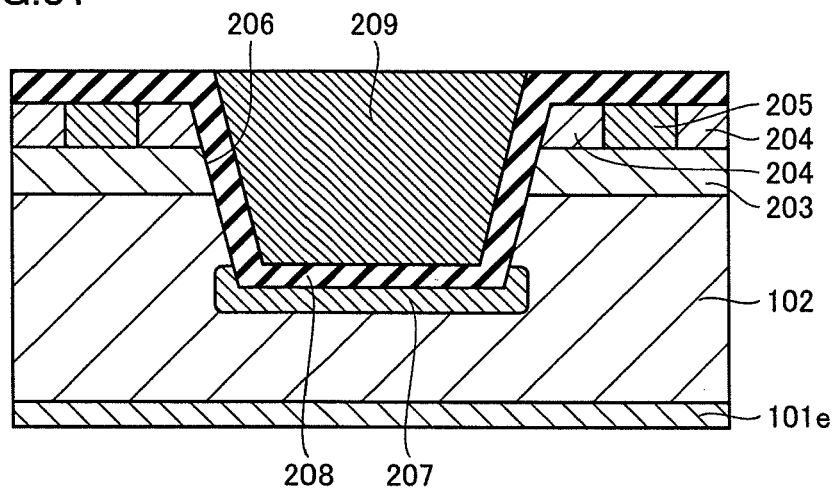
FIG. 31 is a partial cross sectional view schematically showing a ninth step of the method for manufacturing the semiconductor device in accordance with Embodiment 4 of the present invention.

As shown in FIG. 30, gate insulating film 208 is formed to extend from the inside of trench 206 onto the upper surfaces of emitter region 204 and p$^+$ region 205 (FIG. 2: step S105). As shown in FIG. 31, gate electrode 209 is formed on gate insulating film 208 so as to fill the inside of trench 206 (FIG. 2: step S106).

Figure 32:
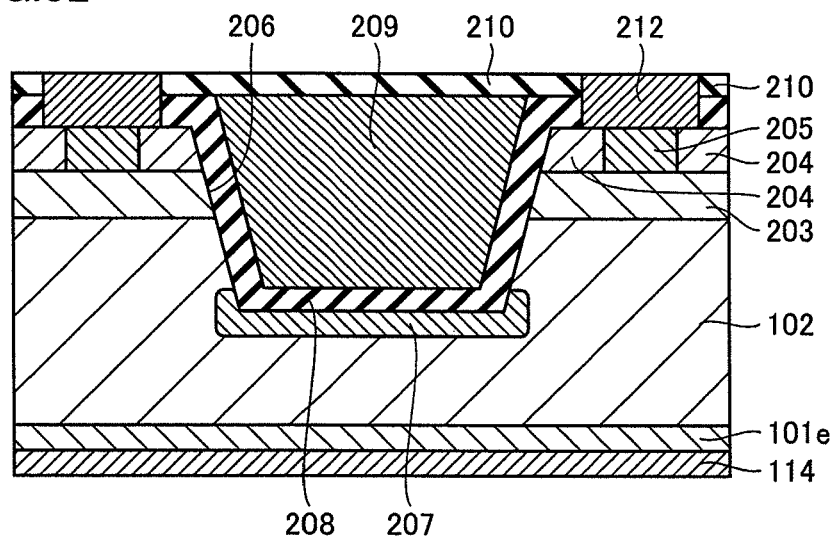
FIG. 32 is a partial cross sectional view schematically showing a tenth step of the method for manufacturing the semiconductor device in accordance with Embodiment 4 of the present invention.

As shown in FIG. 32, interlayer insulating film 210 is formed to cover an upper surface of gate electrode 209 and an upper surface of gate insulating film 208 exposed on p$^+$ region 205. An opening is formed in interlayer insulating film 210 and gate insulating film 208. The opening has a bottom portion at which p$^+$ region 205 and a portion of emitter region 204 are exposed. Next, emitter contact electrode 212 is formed of a conductor film filling the inside of the opening. Emitter contact electrode 212 is an ohmic electrode making ohmic contact with p$^+$ region 205 and emitter region 204. Further, collector electrode 114 is formed on the bottom surface side of collector layer 101e.

Subsequently, emitter wire 213 (FIG. 22) that makes contact with an upper surface of emitter contact electrode 212 and extends on an upper surface of interlayer insulating film 210 is formed. Thereby, silicon carbide semiconductor device 200e is formed.

Also according to the present embodiment, an effect substantially identical to that in Embodiment 1 is obtained.

Embodiment 5

Figure 33:
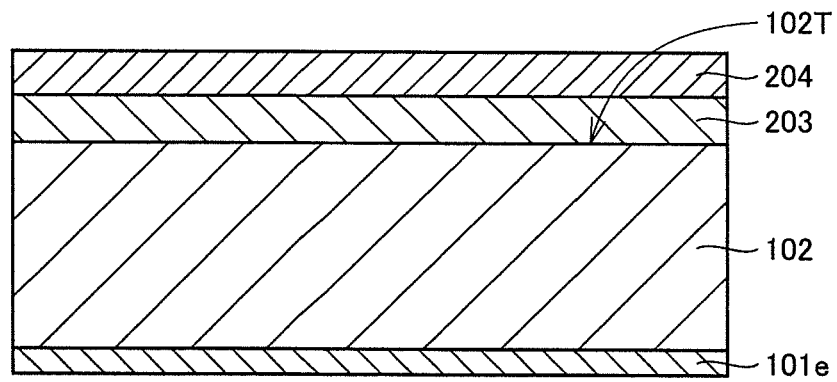
FIG. 33 is a partial cross sectional view schematically showing one step of a method for manufacturing a semiconductor device in accordance with Embodiment 5 of the present invention.

A silicon carbide semiconductor device in the present embodiment is substantially identical to silicon carbide semiconductor device 200e (FIG. 22) in Embodiment 4. A method for manufacturing the same is generally performed through steps S201 to S206 (FIG. 12). Specifically, firstly, as steps S201 to S203 (FIG. 12), the steps identical to those up to the step in FIG. 15 (Embodiment 2) are performed. Next, as shown in FIG. 33, on top surface side 102T of drift layer 102, body region 203 and emitter region 204 as those in Embodiment 4 are formed (FIG. 12: step S204). Subsequently, as the steps including steps S205 and S206 (FIG. 12), the steps identical to those from the step in FIG. 25 (Embodiment 4) are performed. Thereby, a configuration substantially identical to that of silicon carbide semiconductor device 200e is obtained.

Also according to the present embodiment, an effect substantially identical to that in Embodiment 2 is obtained.

Embodiment 6

Figure 34:
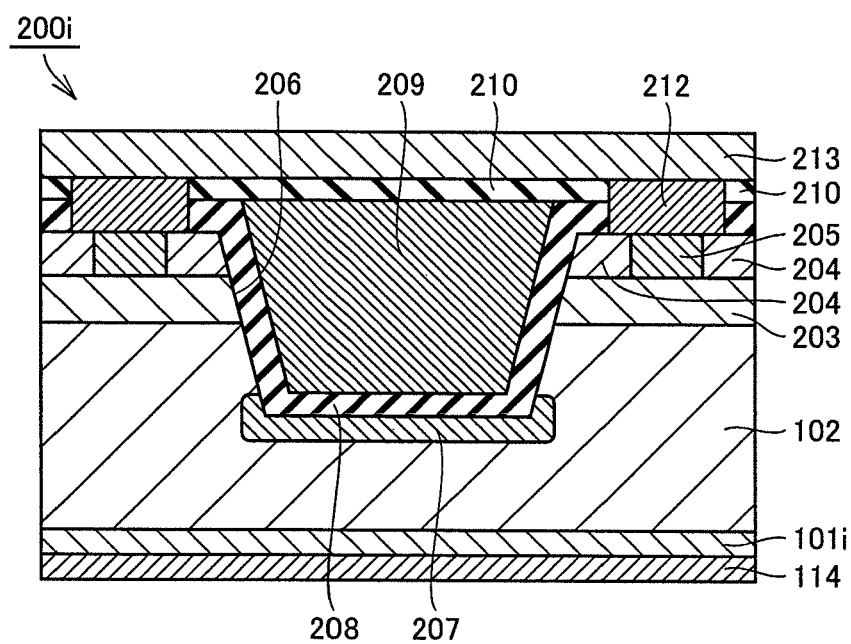
FIG. 34 is a cross sectional view schematically showing a configuration of a silicon carbide semiconductor device in accordance with Embodiment 6 of the present invention.

As shown in FIG. 34, a silicon carbide semiconductor device 200i in the present embodiment has collector layer 101i having an acceptor type impurity introduced by ion implantation, instead of collector layer 101e having an acceptor type impurity introduced by epitaxial growth. Since the configuration of silicon carbide semiconductor device 200i is substantially identical to that of silicon carbide semiconductor device 200e (FIG. 22) in Embodiment 5 other than that, the same or corresponding elements are given the same reference characters and are not described repeatedly.

A method for manufacturing silicon carbide semiconductor device 200i is generally performed through steps S201 to S206 (FIG. 12). Specifically, firstly, the steps identical to those up to the step in FIG. 18 in Embodiment 3 are performed (FIG. 12: steps S201 and S203). Thereafter, the steps from the step in FIG. 33 in Embodiment 5 are performed, and thereby silicon carbide semiconductor device 200i (FIG. 34) is obtained.

Also according to the present embodiment, an effect substantially identical to that in Embodiment 3 is obtained.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
   forming, on a silicon carbide substrate having n type, a collector layer having a bottom surface side facing said silicon carbide substrate and a top surface side opposite to said bottom surface side and having p type;
   forming a drift layer having n type on said top surface side of said collector layer;
   forming a body region provided on said drift layer and having p type, and an emitter region provided on said body region to be separated from said drift layer by said body region and having n type;
   forming a gate insulating film on said body region to connect said drift layer and said emitter region;
   forming a gate electrode on said gate insulating film; and
   exposing said bottom surface side of said collector layer by removing said silicon carbide substrate.

2. The method for manufacturing a silicon carbide semiconductor device according to claim 1, wherein the step of exposing said bottom surface side of said collector layer is performed before the step of forming said gate electrode.

3. The method for manufacturing a silicon carbide semiconductor device according to claim 1, wherein the step of exposing said bottom surface side of said collector layer is performed before the step of forming said gate insulating film.

4. The method for manufacturing a silicon carbide semiconductor device according to claim 1, wherein the step of exposing said bottom surface side of said collector layer includes the step of removing a portion of said bottom surface side of said collector layer.

5. The method for manufacturing a silicon carbide semiconductor device according to claim 1, wherein the step of forming said collector layer is performed by depositing silicon carbide to a thickness of not less than 10 μm.

6. The method for manufacturing a silicon carbide semiconductor device according to claim 1, wherein the step of exposing said bottom surface side of said collector layer is performed such that said collector layer remains with a thickness of not less than 5 μm.

7. The method for manufacturing a silicon carbide semiconductor device according to claim 1, wherein the step of forming said collector layer is performed by depositing silicon carbide containing an acceptor type impurity at a concentration of not less than $1 \times 10^{17}$ cm$^3$ and not more than $1 \times 10^{21}$ cm$^3$.

8. A method for manufacturing a silicon carbide semiconductor device, comprising the steps of:
   forming, on a silicon carbide substrate having n type, a drift layer having a bottom surface side facing said silicon carbide substrate and a top surface side opposite to said bottom surface side and having n type;
   exposing said bottom surface side of said drift layer by removing said silicon carbide substrate;
   forming a collector layer having p type on said bottom surface side of said drift layer;
   forming a body region provided on said top surface side of said drift layer and having p type, and an emitter region provided on said body region to be separated from said drift layer by said body region and having n type, after the step of forming said collector layer;
   forming a gate insulating film on said body region to connect said drift layer and said emitter region; and
   forming a gate electrode on said gate insulating film.

9. The method for manufacturing a silicon carbide semiconductor device according to claim 8, wherein the step of forming said collector layer is performed by epitaxial growth on said bottom surface side of said drift layer.

10. The method for manufacturing a silicon carbide semiconductor device according to claim 8, wherein the step of forming said collector layer is performed by implanting an impurity onto said bottom surface side of said drift layer.

11. The method for manufacturing a silicon carbide semiconductor device according to claim 10, further comprising the steps of:
    performing activation annealing for activating said impurity in said collector layer after the step of forming said collector layer; and
    performing sacrificial oxidation on said collector layer after the step of performing said activation annealing.

12. The method for manufacturing a silicon carbide semiconductor device according to claim 11, further comprising the steps of:
    forming a protection layer on said collector layer before the step of performing said activation annealing; and
    removing said protection layer by oxidation after the step of performing said activation annealing.

13. The method for manufacturing a silicon carbide semiconductor device according to claim 12, wherein said protection layer is a carbon layer.

14. The method for manufacturing a silicon carbide semiconductor device according to claim 8, wherein the step of exposing said bottom surface side of said drift layer includes the step of removing a portion of said bottom surface side of said drift layer.

15. The method for manufacturing a silicon carbide semiconductor device according to claim 8, wherein the step of exposing said bottom surface side of said drift layer is performed such that said drift layer remains with a thickness of not less than 75 μm.

* * * * *